United States Patent
Mbouombouo et al.

(10) Patent No.: US 6,532,577 B1
(45) Date of Patent: Mar. 11, 2003

(54) TIMING DRIVEN INTERCONNECT ANALYSIS

(75) Inventors: Benjamin Mbouombouo, San Jose, CA (US); Johann Leyrer, Munich (DE); Human Boluki, Munich (DE)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/894,618

(22) Filed: Jun. 27, 2001

(51) Int. Cl.[7] ............................................... G06F 17/50
(52) U.S. Cl. ........................ 716/6; 716/10; 716/11
(58) Field of Search ............................ 716/4, 5, 6, 10, 716/11, 12, 13, 18; 703/22, 19

(56) References Cited

U.S. PATENT DOCUMENTS 5,819,072 A  * 10/1998  Bushard et al. .............. 395/500
6,260,185 B1 *  7/2001  Sasaki et al. .................. 716/18
6,286,126 B1 *  9/2001  Raghavan et al. .............. 716/6
6,289,498 B1 *  9/2001  Dupenloup .................... 716/18
6,327,692 B1 * 12/2001  Brown .......................... 716/1

OTHER PUBLICATIONS

"Synthesis Methodology for Large Designs" Design Compiler 1997.01 Release, Jun. 1997, Don Chang, et al., http://www.synopsys.com/products/logic/dc_wp97.html.

* cited by examiner

*Primary Examiner*—Tuan T. Lam
*Assistant Examiner*—An T. Luu
(74) *Attorney, Agent, or Firm*—Sawyer Law Group LLP

(57) ABSTRACT

A method for performing timing driven interconnect estimation analysis is disclosed. The method includes collecting data only from timing critical paths of at least one previous design, and generating statistical data based on a net length distribution of the timing critical paths. A wire load model is then generated for a new design from the statistical data.

30 Claims, 3 Drawing Sheets

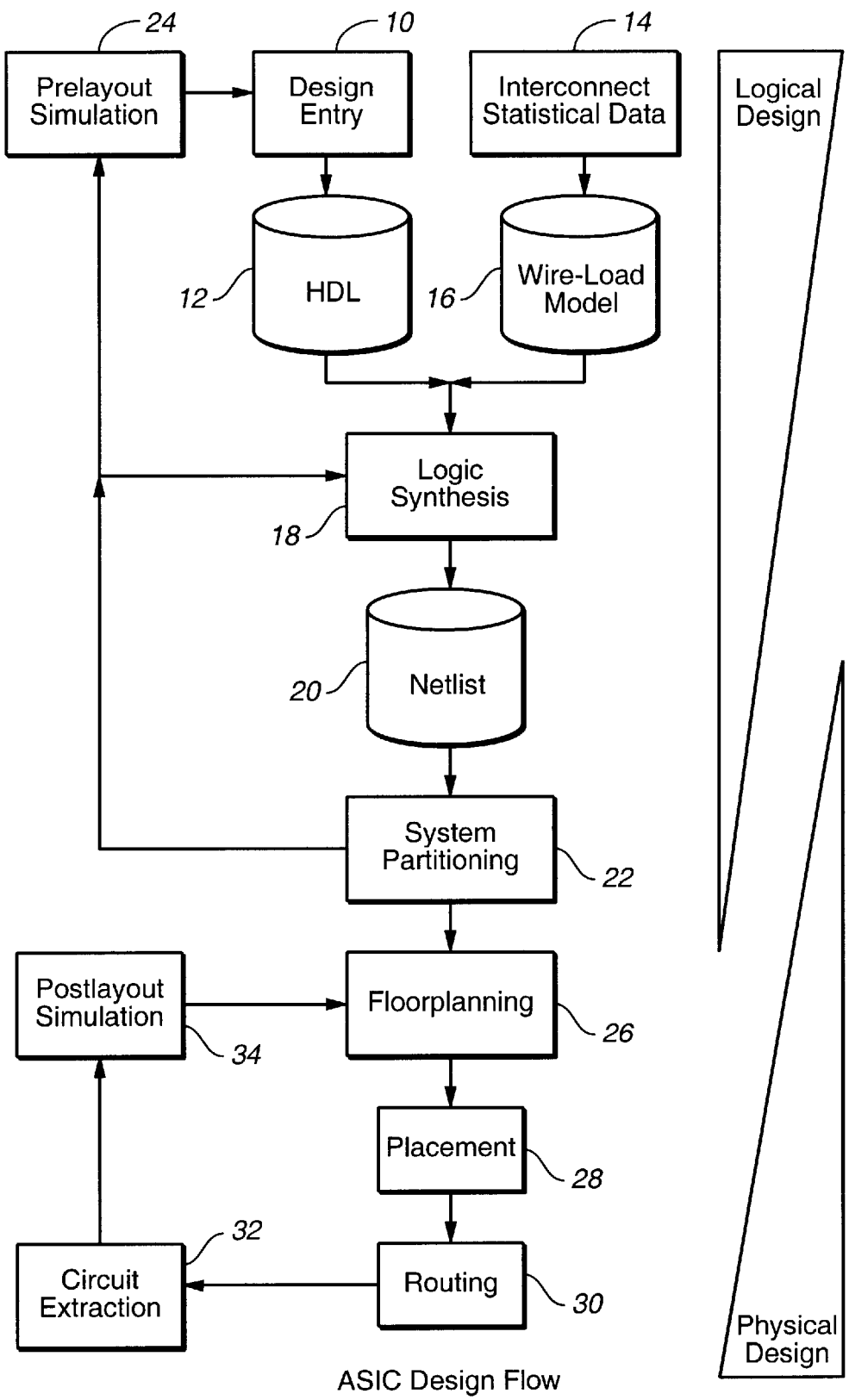
ASIC Design Flow
*FIG._1*

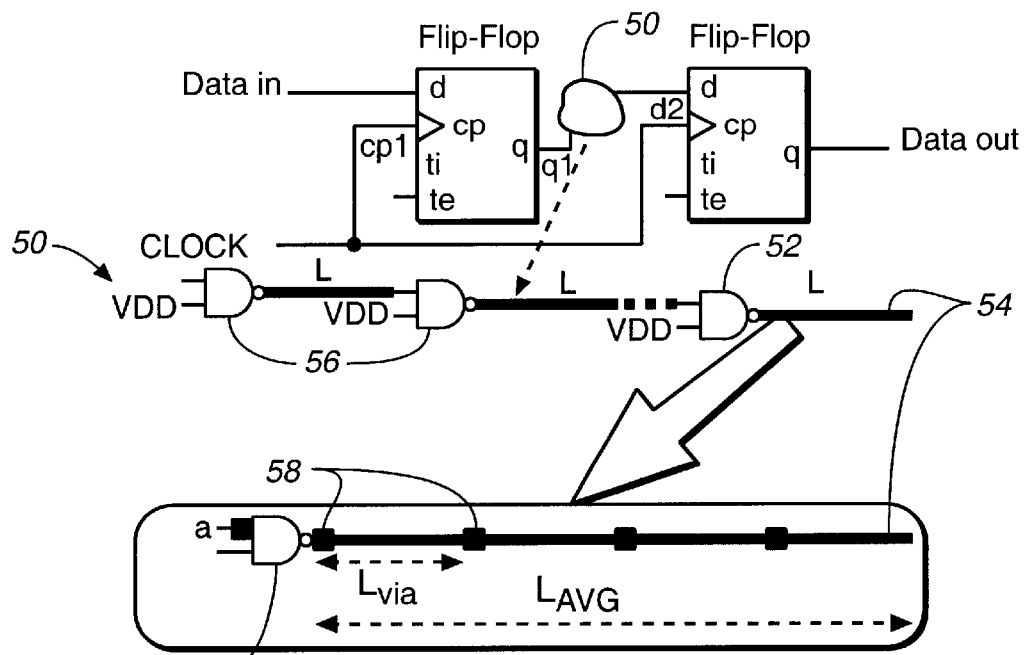
FIG._2
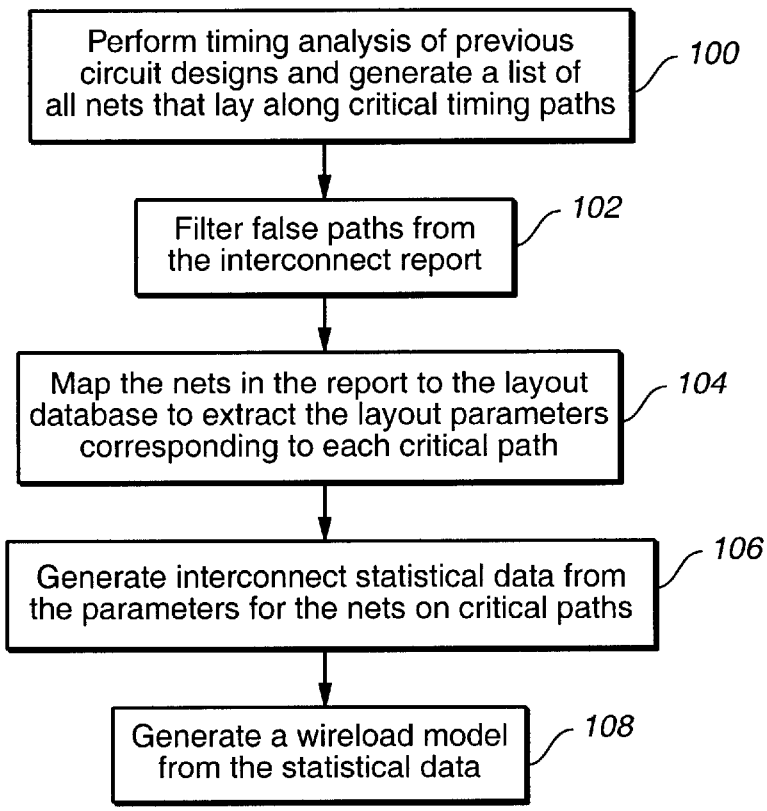
FIG._3

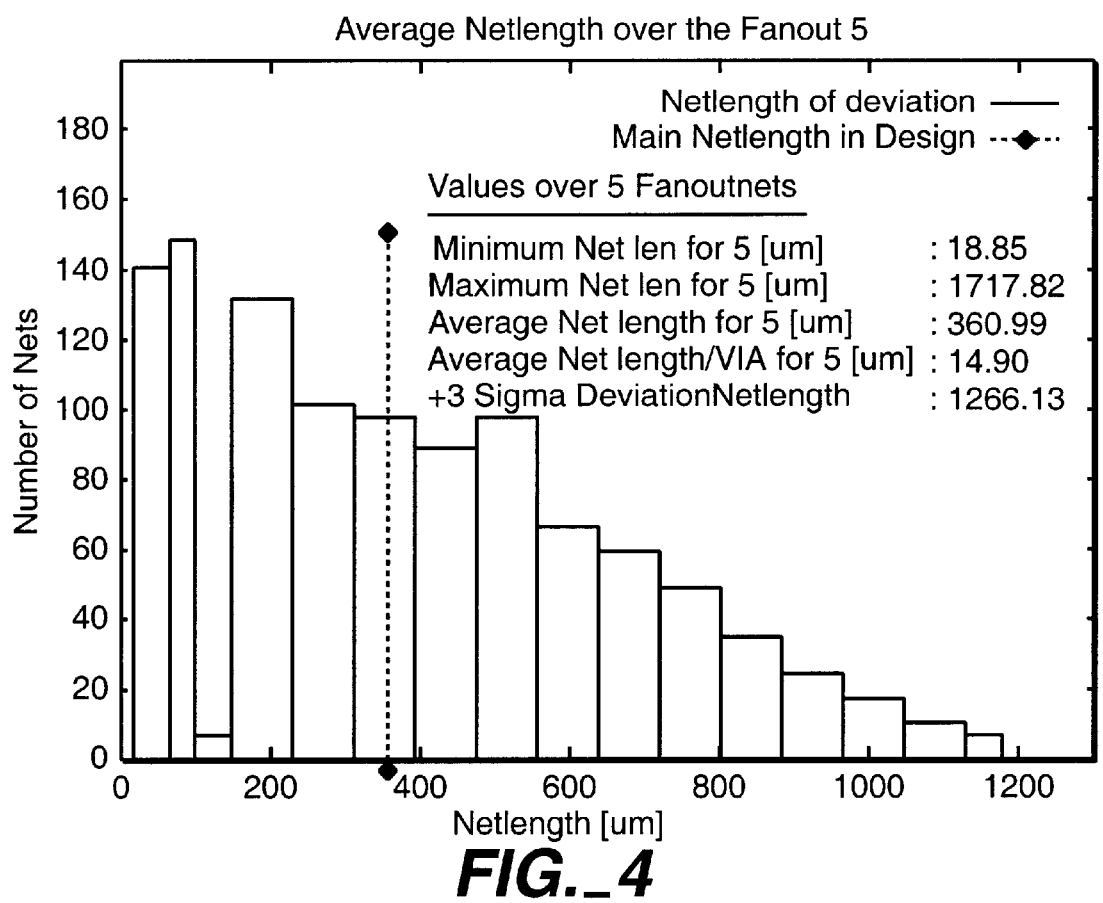
FIG._4

TIMING DRIVEN INTERCONNECT ANALYSIS

FIELD OF THE INVENTION

The present invention relates to ASIC design methodologies, and more particularly to a timing driven method for performing interconnect estimation analysis used in front-end design processes, such as logic synthesis, floorplanning, and performance analysis.

BACKGROUND OF THE INVENTION

An application specific integrated circuit (ASIC) is a chip that is custom designed for a specific application, rather than a general-purpose chip such as a microprocessor. An ASIC chip performs an electronic operation as fast as it is possible to do so, providing, of course, that the circuit design is efficiently architected.

FIG. 1 is a block diagram illustrating a basic design flow for fabricating an ASIC. The design flow includes a front-end design process that creates a logical design for the ASIC, and a backend design process that creates a physical design for the ASIC. The front-end design process begins with providing a design entry 10 for an electronic circuit that is used to generate a high-level electronic circuit description, which is typically written in a Hardware Description Language (HDL) 12. Although many proprietary HDLs have been developed, Verilog and VHDL are the major standards.

The design includes a list of interconnections that need to be made between the cells of the circuit; but physical properties for the interconnects have yet to be determined. Therefore, the designer needs an estimation of physical properties to help determine a timing within circuit. Interconnect data from previous designs are used to generate interconnect statistical data to use as the estimation in step 14. The interconnect statistical data is used to create a wire load model 16, which defines the resistance, capacitance, and the area of all nets in the design. The statistically generated wire load model 16 is used to estimate the wire lengths in the design and define how net delays are computed.

The HDL 12 and the wire load model 16 are then input into a logic synthesis tool 18 to generate a list of logic gates and their interconnections, called a "netlist" 20. It is important to use wire load models 16 when synthesizing a design, otherwise, timing information generated from synthesis will be optimistic in the absence of net delays. The timing information will also be inaccurate when a poor wire load model 16 is used.

Next, system partitioning is performed in step 22 in which the physical design is partitioned to define groupings of cells small enough to be timed accurately with wire load models 16 (local nets). The resulting design typically includes many cells with many interconnect paths, with many having large fanins and fanouts. A prelayout simulation is then performed in step 24 with successive refinement to the design entry 10 and to logic synthesis 18 to determine if the design functions properly.

After prelayout simulation 24 is satisfactory, the backend design process begins with floorplanning in step 26 in which the blocks of the netlist 20 are arranged on the chip. The location of the cells in the blocks are then determined during a placement process in step 28. A routing process makes connections between cells and blocks in step 30. Thereafter, circuit extraction determines the resistance and capacitance of the interconnects in step 32. A postlayout simulation is then performed in step 34 with successive refinement to floorplanning 26 as necessary.

Although the physical knowledge of previous designs are incorporated early in the design flow, the design flow typically results in many post-layout design iterations to obtain timing closure between the finished physical design and the logical design. The post-layout timing iterations are due primarily to inaccurate wireload models 16 used at the front-end of the design cycle during logic synthesis 18. Inaccurate wire load models 16 typically result from inaccurate analysis of the interconnect data of previous designs. The analysis of interconnect data for deep submicron designs may be even more inaccurate and may require even more iterative loops to obtain timing closure. The additional loops can add weeks or months to a project schedule and significantly increase the cost of the design.

Accordingly, what is needed is an improved method for analyzing interconnect data from previous designs for the generation of accurate wireload models during the ASIC design process. The present invention addresses such a need.

SUMMARY OF THE INVENTION

The present invention provides a method for performing timing driven interconnect estimation analysis. The method includes collecting data only from timing critical paths of at least one previous design, and generating statistical data based on a net length distribution of the timing critical paths. The method further includes generating a wire load model for a new design from the statistical data.

According to the system and method disclosed herein, the present invention provides a more accurate analysis of the interconnect data of previous designs, and therefore results in more accurate wireload models used for logic synthesis at the front-end of the design cycle. Consequently, the number post-layout timing iterations required to obtain timing closure will be minimized, thereby reducing the cost of the design.

BRIEF DESCRIPTION OF THE DRAWINGS

FIG. 1 is a block diagram illustrating a basic design flow for fabricating an ASIC.

FIG. 2 is a diagram illustrating an example path, which is located between two flip-flops of a circuit.

FIG. 3 is a flow chart illustrating a process for generating accurate generic wireload models from interconnect analysis in accordance with a preferred embodiment of the present invention.

FIG. 4 is a graph showing an example interconnect distribution over an interconnect fanout of 5.

DETAILED DESCRIPTION

The present invention relates to a method for performing timing driven interconnect estimation analysis for front-end ASIC design and power generation estimation. The following description is presented to enable one of ordinary skill in the art to make and use the invention and is provided in the context of a patent application and its requirements. Various modifications to the preferred embodiments and the generic principles and features described herein will be readily apparent to those skilled in the art. Thus, the present invention is not intended to be limited to the embodiments shown but is to be accorded the widest scope consistent with the principles and features described herein.

During ASIC design flow, statistical data generated from interconnect data of previous designs is used to help estimate timing within the current circuit design. FIG. 2 is a diagram illustrating an example interconnect path through a circuit from which the interconnect data is obtained. Although the example highlights one interconnect path 50 located between two flip-flops, the circuit may contain hundreds of such paths. Each path includes a series of N cells 52 that are connected by interconnects 54, where the group of interconnects 54 output from each cell 52 is referred to as a net 56. One or more vias 58 may be located along each interconnect 54 within a net 56. The number of interconnects 54 in a net 56 is referred to as the fanout. For example, a cell 52 that has five output interconnects 54 has a fanout of 5.

A layout database is used to store the interconnect data for any number of previous designs. The data for each design includes a net list that specifies the number of cells, interconnects, and vias, the length of each interconnect, the length of each interconnect between each pair of vias, and fanout data for each net. In the convention design flow, wire load models are generated based on statistical data obtained by analyzing every interconnect path in the previous designs. This results in inaccurate statistical data, which leads to inaccurate wire load models. As a consequence, many post-layout timing iterations are required to obtain timing closure between the front-end timing estimations and the actual physical design.

The present invention provides a method for performing timing driven interconnect estimation analysis for front-end ASIC design and power generation estimation that leads to improved wire load models 16. According to the present invention, instead of generating wire load models 16 based on statistical data obtained by analyzing every net 56 in a group of previous designs, the present invention obtains more accurate statistical data by collecting data only from timing critical paths in a group of previous designs. Statistical data based on a net length distribution of the timing critical paths is then generated, and a wire load model 16 for a new design is generated from the statistical data.

Examining only the critical nets provides a more accurate analysis of the interconnect data of previous designs, and therefore results in more accurate wireload models 16 used for logic synthesis 18 at the front-end of the design cycle. The back-end process will then be constrained to place timing critical interconnects in the design first. This causes the timing estimates produced by the front-end design to more closely match the timing that occurs in physical design. The design will therefore require minimal post-layout timing iterations to obtain timing closure, thereby reducing the cost of the design.

FIG. 3 is a flow chart illustrating a process for generating accurate generic wireload models 16 from interconnect analysis in accordance with a preferred embodiment of the present invention. The present invention provides an improved process for generating interconnect estimation analysis for the generation of wireload models 16 for synthesis 18, and replaces the conventional interconnect statistical data 14 of FIG. 1.

The process begins by performing a timing analysis of previous circuit designs that are stored in a layout database and generating a list of all nets 56 that lay along critical timing paths in step 100. For a typically design, the timing analysis requires 15–20 million passes. In a preferred embodiment, nets 56 on critical paths are those that have up to a 20% delay margin. For example, for a 200 Mhz design, the slowest/longest path must operate at no less than 200 Mhz. Most paths will operate faster, such as at 300 Mhz or higher. However, all paths operating between 200 and 240 Mhz (20%) are assumed to be critical paths. The output of the timing analysis is a critical-path interconnect report listing all of the nets 56 on critical paths found in the designs searched in the layout database.

A list of false paths is then input to a filtering process to strip the interconnect report of all paths that the designer or customer has declared as not critical in step 102. In a preferred embodiment, the list of false paths includes multicycle paths, which are paths that operate on two clock cycles. Filtering multicycle paths generally reduces the number nets 56 in the critical-path interconnect report because there are often a large amount of multicycle paths in the report.

Next, a timing analysis script takes the filtered interconnect report and maps the nets in the report to the layout database to extract layout parameters from the database corresponding to each critical path in step 104. The parameters extracted from the database for each net in the interconnect report include the fanout, the length (L) of each interconnect, and the number of vias along each interconnect. The output of the extraction is a netlength report.

After the parameters are extracted, interconnect statistical data is generated from the parameters for the nets on critical paths in step 106. According to the present invention, the statistics generated from the netlength report include:

Number of nets,

Total interconnect length,

Total number of vias,

Average length of interconnects (Lavg),

Average length of the interconnects between vias (Lvia),

Interconnect length distribution—typically a gaussian curve,

Average interconnect length over fanout, and

Interconnect distribution over fanout—1σ, 2σ, and 3σ may be defined for every fanout. FIG. 4 is a graph showing an example interconnect distribution over an interconnect fanout of 5. The Y-axis of the graph is the number of nets observed in particular designs, and the X-axis is the average net length observed in the corresponding designs. The example graph shows the minimum, maximum, average length, and average length/via for all critical path interconnects having a fanout of 5. Given a distribution graph, a center point on the graph is where 50 percent of the net lengths would be above, and 50 percent below. An interconnect distribution of 1 Sigma covers 68.3 percent of the distribution moving to the left and to the right of the center, which is the average value of the distribution. An interconnect distribution of 2 Sigma covers 95%, and an interconnect distribution of 3 Sigma covers 99.7%, almost the entire design. Depending on the present design, either 1σ, 2σ, and 3σ may be used.

After the statistics are generated, the statistics are used to generate a wireload model in step 108, and the ASIC design flow continues as shown in FIG. 1. According to the present invention, the statistical data generated by the present invention may be used for performance analysis for the new design, future process technology definition, and power estimation.

The interconnect statistics generated by the present invention provide a clear understanding of the design behavior in terms interconnect length in the timing critical paths. Based on a wide range of previous designs, the present invention yields a more accurate representation of interconnect behavior in different design types and therefore result in a more accurate wireload model. Lavg and Lvia are very important parameters for defining the next process technology because the more accurate they are, the more stable timing closure will be at the beginning of the timing iterations. By extracting these parameters only for critical paths in the previous designs, the accuracy of Lavg and Lvia is increased.

The present invention has been described in accordance with the embodiments shown, and one of ordinary skill in the art will readily recognize that there could be variations to the embodiments, and any variations would be within the spirit and scope of the present invention. In addition, software written according to the present invention may be stored on a computer-readable medium, such as a removable memory, or transmitted over a network, and loaded into a computer for execution. Accordingly, many modifications may be made by one of ordinary skill in the art without departing from the spirit and scope of the appended claims.

What is claimed is:

1. A method for performing timing driven interconnect estimation analysis for a current design, the method comprising the steps of:

(a) collecting data only from timing critical paths of at least one previous design;

(b) generating statistical data based on a net length distribution of the timing critical paths; and (c) generating a wire load model for the current design from the statistical data, thereby reducing post-layout timing iterations required to obtain timing closure for the current design.

2. The method of claim 1 wherein step (a) further includes the step of performing timing analysis on multiple circuit designs to generate a list of nets on critical paths.

3. The method of claim 2 wherein step (a) further includes the step of filtering false nets from the list of nets on critical paths to obtain filtered nets.

4. The method of claim 3 wherein step (a) further includes the step of filtering multicycle nets from the list of nets on critical paths.

5. The method of claim 4 wherein step (b) further includes the step of mapping each of the filtered nets to an entry in a layout database, and for every fanout associated with each filtered net in the layout database, extracting the net length distribution.

6. The method of claim 5 wherein step (b) further includes the step of generating an average number of vias, average interconnect lengths, and 1σ, 2σ, and 3σ.

7. The method of claim 6 wherein step (c) further includes the step of using the statistical data for statistical performance analysis for the new design and future process technology definition and power estimation.

8. A method for performing timing driven interconnect estimation analysis for a current design, the method comprising the steps of:

(a) performing timing analysis on multiple circuit designs to generate a list of nets on critical paths;

(b) filtering false nets from the list of nets on critical paths to obtain filtered nets;

(c) generating a net length distribution from the filtered nets; and (d) generating a generic wire load model from the net length distribution for front-end synthesis of the current design.

9. The method of claim 8 wherein step (a) further includes the step of outputting a critical-path interconnect report listing all of the critical paths found in the designs searched in a layout database.

10. The method of claim 9 wherein step (b) further includes the step of filtering multicycle paths from the list of nets on critical paths.

11. The method of claim 10 wherein step (c) further includes the step of mapping each of the filtered nets to an entry in the layout database, and for every fanout associated with each filtered net in the layout database, extracting the net length distribution.

12. The method of claim 11 wherein step (c) further includes the step of extracting layout parameters from the layout database corresponding to each net.

13. The method of claim 12 wherein step (c) further includes the step of extracting fanout, length (L) of each interconnect, and a number of vias along each interconnect.

14. The method of claim 13 wherein step (c) further includes the step of generating interconnect statistical data from the parameters for the nets on critical paths.

15. The method of claim 14 wherein the interconnect statistical data includes:

number of nets, total interconnect length, total number of vias, average length of interconnects (lavg), average length of the interconnects between vias (lvia), interconnect length distribution, average interconnect length over fanout, and interconnect distribution over fanout for 1σ, 2σ, and 3σ.

16. A computer readable medium containing program instructions for performing timing driven interconnect estimation analysis for a current design, the program instructions for:

(a) collecting data only from timing critical paths of at least one previous design;

(b) generating statistical data based on a net length distribution of the timing critical paths; and (c) generating a wire load model for the current design from the statistical data, thereby reducing post-layout timing iterations required to obtain timing closure for the current design.

17. The computer readable medium of claim 16 wherein instruction (a) further includes the instruction of performing timing analysis on multiple circuit designs to generate a list of nets on critical paths.

18. The computer readable medium of claim 17 wherein instruction (a) further includes the instruction of filtering false nets from the list of nets on critical paths to obtain filtered nets.

19. The computer readable medium of claim 18 wherein instruction (a) further includes the instruction of filtering multicycle nets from the list of nets on critical paths.

20. The computer readable medium of claim 19 wherein instruction (b) further includes the instruction of mapping each of the filtered nets to an entry in a layout database, and for every fanout associated with each filtered net in the layout database, extracting the net length distribution.

21. The computer readable medium of claim 20 wherein instruction (b) further includes the instruction of generating an average number of vias, average interconnect lengths, and 1σ, 2σ, and 3σ.

22. The computer readable medium of claim 21 wherein instruction (c) further includes the instruction of using the statistical data for statistical performance analysis for the new design and future process technology definition and power estimation.

23. A computer readable medium containing program instructions for performing timing driven interconnect estimation analysis for a current design, the program instructions for:

(a) performing timing analysis on multiple circuit designs to generate a list of nets on critical paths;

(b) filtering false nets from the list of nets on critical paths to obtain filtered nets;

(c) generating a net length distribution from the filtered nets; and generating a generic wire load model from the net length distribution for front-end synthesis of the current design.

24. The computer readable medium of claim 23 wherein instruction (a) further includes the instruction of outputting a critical-path interconnect report listing all of the critical paths found in the designs searched in a layout database.

25. The computer readable medium of claim 24 wherein instruction (b) further includes the instruction of filtering multicycle paths from the list of nets on critical paths.

26. The computer readable medium of claim 25 wherein instruction (c) further includes the instruction of mapping each of the filtered nets to an entry in the layout database, and for every fanout associated with each filtered net in the layout database, extracting the net length distribution.

27. The computer readable medium of claim 26 wherein instruction (c) further includes the instruction of extracting layout parameters from the layout database corresponding to each net.

28. The computer readable medium of claim 27 wherein instruction (c) further includes the instruction of extracting fanout, length (L) of each interconnect, and number of vias along each interconnect.

29. The computer readable medium of claim 28 wherein instruction (c) further includes the instruction of generating interconnect statistical data from the parameters for the nets on critical paths.

30. The computer readable medium of claim 29 wherein the interconnect statistical data includes: number of nets, total interconnect length, total number of vias, average length of interconnects (lavg), average length of the interconnects between vias (lvia), interconnect length distribution, average interconnect length over fanout, and interconnect distribution over fanout for 1 $\sigma$, 2$\sigma$, and 3$\sigma$.

* * * * *